United States Patent
Rogers

(10) Patent No.: US 10,256,024 B1
(45) Date of Patent: Apr. 9, 2019

(54) POWER CONVERTER TEMPERATURE ESTIMATION

(71) Applicant: Ford Global Technologies, LLC, Dearborn, MI (US)

(72) Inventor: Craig Brian Rogers, Belleville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/871,668

(22) Filed: Jan. 15, 2018

(51) Int. Cl.
| | |
|---|---|
| *G01R 19/10* | (2006.01) |
| *G01R 19/12* | (2006.01) |
| *G01R 19/165* | (2006.01) |
| *G01R 19/15* | (2006.01) |
| *G01R 19/155* | (2006.01) |
| *H02J 3/26* | (2006.01) |
| *H02M 3/158* | (2006.01) |
| *H01F 27/00* | (2006.01) |
| *H02M 3/145* | (2006.01) |
| *H02J 1/04* | (2006.01) |

(52) U.S. Cl.
CPC .......... *H01F 27/008* (2013.01); *G01R 19/10* (2013.01); *G01R 19/12* (2013.01); *H02J 1/04* (2013.01); *H02M 3/145* (2013.01)

(58) Field of Classification Search
CPC ...... G01R 19/10; G01R 19/12; G01R 19/165; G01R 19/15; G01R 19/155; H02J 3/26; H02J 1/04; H02M 3/1584; H01F 27/008
See application file for complete search history.

(56) References Cited

U.S. PATENT DOCUMENTS

| | | | |
|---|---|---|---|
| 4,045,787 A | 8/1977 | Sidor et al. | |
| 5,712,802 A | 1/1998 | Kumar et al. | |
| 9,562,812 B2 | 2/2017 | Yoshimura | |
| 2007/0001658 A1* | 1/2007 | Nguyen | G06F 1/26 323/290 |
| 2012/0105078 A1* | 5/2012 | Kikuchi | G01R 19/0092 324/654 |
| 2012/0306412 A1* | 12/2012 | Tang | H02M 3/155 318/400.3 |
| 2013/0134777 A1* | 5/2013 | de Sousa | B60L 11/1805 307/10.1 |
| 2015/0280569 A1* | 10/2015 | Chen | H02M 3/155 323/312 |
| 2018/0061566 A1* | 3/2018 | Lee | H01F 27/255 |
| 2018/0091111 A1* | 3/2018 | Wennerstrom | H01F 27/255 |

FOREIGN PATENT DOCUMENTS

WO 2003095960 A1 11/2003

OTHER PUBLICATIONS

Magnetics Powder Core Powder Cores Molypermalloy | High Flux | Kool Mµ® | XFlux © 2015 Magnetics, www.mag-inc.com.*

* cited by examiner

*Primary Examiner* — Timothy J. Dole
*Assistant Examiner* — Sisay G Tiku
(74) *Attorney, Agent, or Firm* — David Kelley; Brooks Kushman P.C.

(57) ABSTRACT

A vehicle includes a power converter having an inductor electrically disposed between a traction battery and an electric machine. The vehicle includes a controller configured to reduce a power limit of the power converter. The reduction is responsive to an increase of a ratio of voltage across the inductor to a rate of change of current through the inductor.

19 Claims, 3 Drawing Sheets

POWER CONVERTER TEMPERATURE ESTIMATION

TECHNICAL FIELD

The present disclosure relates to estimation of power converter inductor temperature.

BACKGROUND

Electrified vehicles including hybrid-electric vehicles (HEVs), plugin hybrid electric vehicles (PHEVs), and battery electric vehicles (BEVs) have a DC to DC converter. The DC to DC converter may be a boost converter to increase voltage to an inverter. The converter accommodates the required voltage even when the battery input voltage remains within a narrow range. Because of the large amount of current through the inductor, the temperature of the inductor can rise. Inductor systems include a thermistor or other temperature measurement device to monitor inductor core temperature.

SUMMARY

A vehicle includes a power converter having an inductor electrically disposed between a traction battery and an electric machine. The vehicle includes a controller configured to reduce a power limit of the power converter. The reduction is responsive to an increase of a ratio of voltage across the inductor to a rate of change of current through the inductor.

The controller may be further configured to increase the power limit of the power converter. The increase may be responsive to a decrease in the ratio. The inductor may include a core having an initial permeability that is a monotonic function of the temperature of the core. The inductor may have a powdered iron core. The powdered iron core may be a Molypermalloy Powder core. The Molypermalloy Powder core may have an initial permeability of 550μ.

A vehicle includes a power converter having an inductor electrically disposed between a traction battery and an electric machine. The vehicle includes a controller configured to increase a power limit of the power converter. The increase is responsive to a decrease of a ratio of voltage across the inductor to a rate of change of current through the inductor.

The controller may be further configured to decrease the power limit of the power converter. The decrease may be responsive to an increase in the ratio. The inductor may include a core having an initial permeability that is a monotonic function of the temperature of the core. The inductor may have a powdered iron core. The powdered iron core may be a Molypermalloy Powder core. The Molypermalloy Powder core may have an initial permeability of 550μ.

A method, by a controller, includes adjusting a power limit of a power converter including the inductor electrically disposed between a traction battery and an electric machine. The adjustment is responsive to a change of a ratio of voltage across an inductor to a rate of change of current through the inductor.

The method may further include decreasing the power limit of the power converter. The decrease may be responsive to an increase in the ratio. The method may further include decreasing the power limit of the power converter. The decrease may be responsive to an increase in the ratio.

The inductor may include a core having an initial permeability that is a monotonic function of the temperature of the core. The inductor may have a powdered iron core. The powdered iron core may be a Molypermalloy Powder core. The Molypermalloy Powder core may have an initial permeability of 550μ.

DETAILED DESCRIPTION

Figure 1:
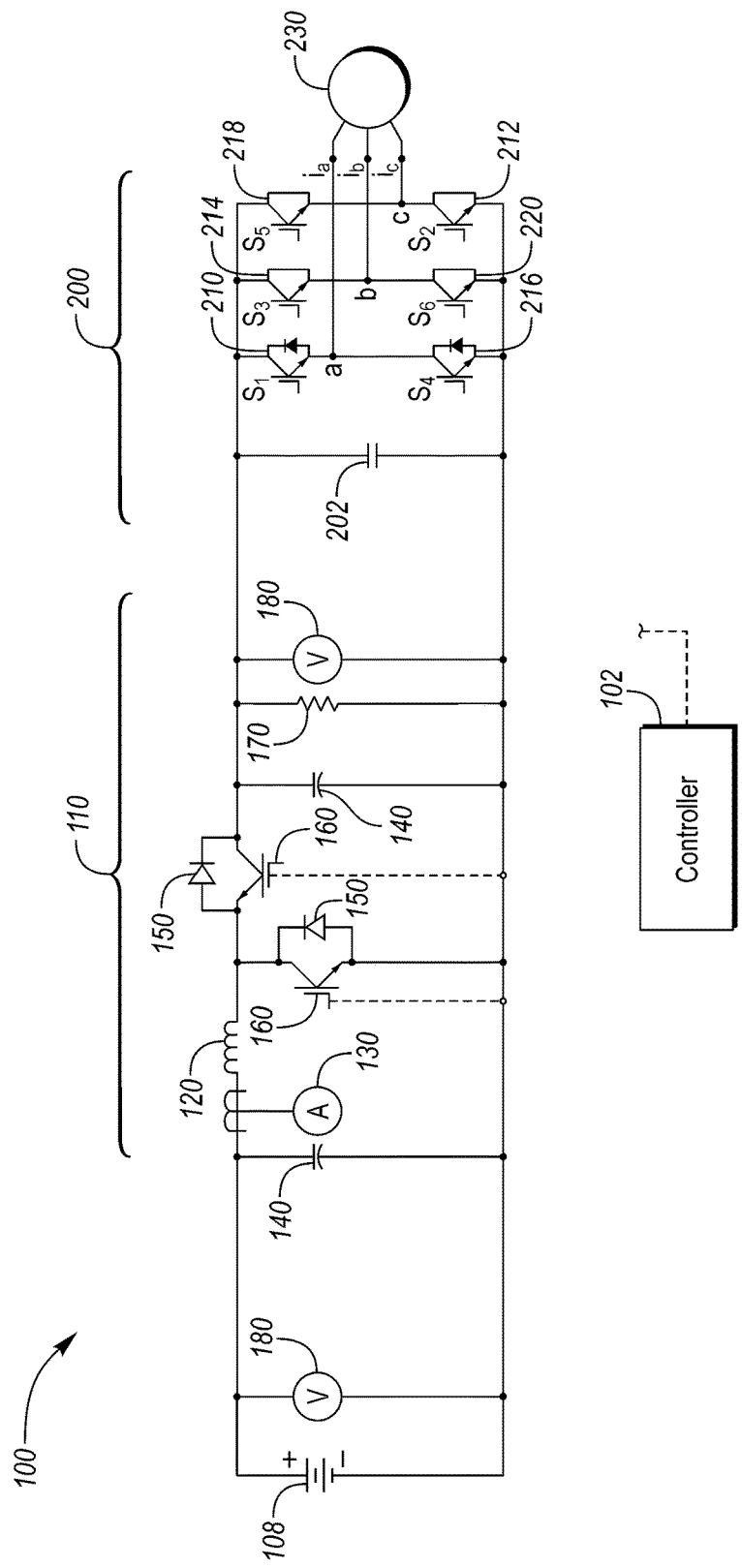
FIG. 1 is a schematic diagram of a power drive system of a vehicle.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Inductors are used in DC to DC power converters to store energy in a magnetic field during one part of an operating cycle, and to return all or part of that energy during another part of the cycle. A boost converter is typically used to supply the desired voltage to traction motors of power systems for electrified vehicles.

During use, the inductor may overheat. In classic systems, the temperature of the inductor is measured directly using a thermistor or another device. The temperature, however, may be estimated without direct measurement using correlations between inductance, temperature, voltage, and current flow. In one example, the correlation is enabled when materials used for inductor cores have a monotonic relationship between initial permeability and temperature for the operational range. A powdered core inductor with a distributed air gap, for example, may have monotonic initial permeability and temperature relationships, which means the initial permeability of the core coincides with one temperature within the operational range. The operational range of the inductor may vary such that various inductors operate over a monotonic range. Since the initial permeability may be correlated to the inductance of the inductor, a determination of the inductance of the inductor may provide temperature characteristics without direct measurement.

For example, a voltage drop across the inductor and a rate of change of current through the inductor may provide the necessary inductance information because a ratio of the voltage and the rate of change of current is equal to the inductance. Further, a controller may be used to limit power through the inductor to prevent overheating using the correlated inductance and temperature information. The controller may have a power threshold that limits the power through the inductor to ensure the temperature of the inductor does not exceed a predetermined temperature threshold. The controller may control power through the inductor via the pulse width modulation signal to the switches of the inverter. Indeed, the controller may ensure temperature limits are not exceeded using measured voltage and current parameters when monotonic inductor core materials are used.

FIG. 1 shows a circuit diagram of the power system 100. The power system 100 includes a high voltage traction battery (or batteries) 108, the high voltage-high current DC to DC converter (or DC/DC converter) 110, an inverter 200, and an AC motor 230. The inverter 200 may include insulated gate bipolar transistors (IGBT) switches 210, 212, 214, 216, 218, 220 and respective flyback diodes. The inverter 200 may include a DC link capacitor 202 to improve voltage stability. The DC/DC converter 110 includes diodes 150 and IGBTs 160. Although IGBTs are shown in FIG. 1, the transistors 160 are not limited to IGBTs and may include other transistors such as MOSFET transistors. The DC/DC converter 110 also includes power inductor 120, capacitors 140, and resistor 170. The DC/DC converter 110 accommodates the required voltage for the power system 100, even while the battery 108 output voltage remains within a narrow range. The system 100 includes an ammeter 130, for sampling current through the inductor, and voltmeters 180 for measuring the voltage of the system 100. Current through the inductor 120 and the magnitude of voltage being switched across the inductor 120 can result in temperature increases of the inductor 120, and thus the potential for the inductor 120 to operate beyond its temperature rating, resulting in durability concerns. A controller 102 receives input from the voltmeters 180, ammeter 130. The controller 102 also calculates a rate of change of the current (di/dt) using a numerical method or receives the rate of change from another controller on a controller network (not shown). The controller may also control switches 160, 210, 212, 214, 216, 218, 220 to operate the converter 110 or inverter 200.

Figure 2:
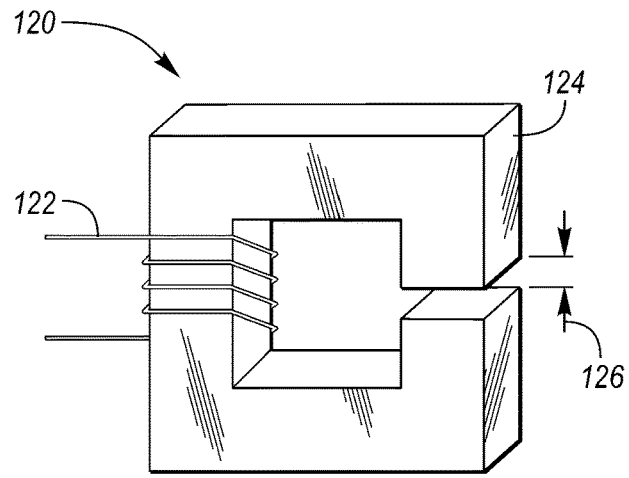
FIG. 2 is a perspective view of a power inductor.

Referring to FIG. 2, a power inductor 120 is shown. The power inductor 120 may have a magnetic core 124. The magnetic core 124 may be a powdered iron core. The powdered iron core may be a Molypermalloy Powder core. The Molypermalloy Powder core may have an initial permeability of 550µ. The magnetic core may be other materials (e.g., iron, silicon, aluminum, nickel, molybdenum) and another initial permeability rating may be used (e.g., 10µ, 20µ). Additionally, a core material that does not have a monotonic function over its entire usable range may be adapted to use the teachings of this disclosure by a restriction of its operational range. For example, a nonmonotonic core material may have a monotonic range that can be utilized with the teachings of this disclosure. The power inductor 120 has an air gap 126. The air gap 126 may be distributed throughout the magnetic core 124 to improve permeability. An excitation winding 122 carries the electrical current of the DC/DC converter 110.

Figure 3:
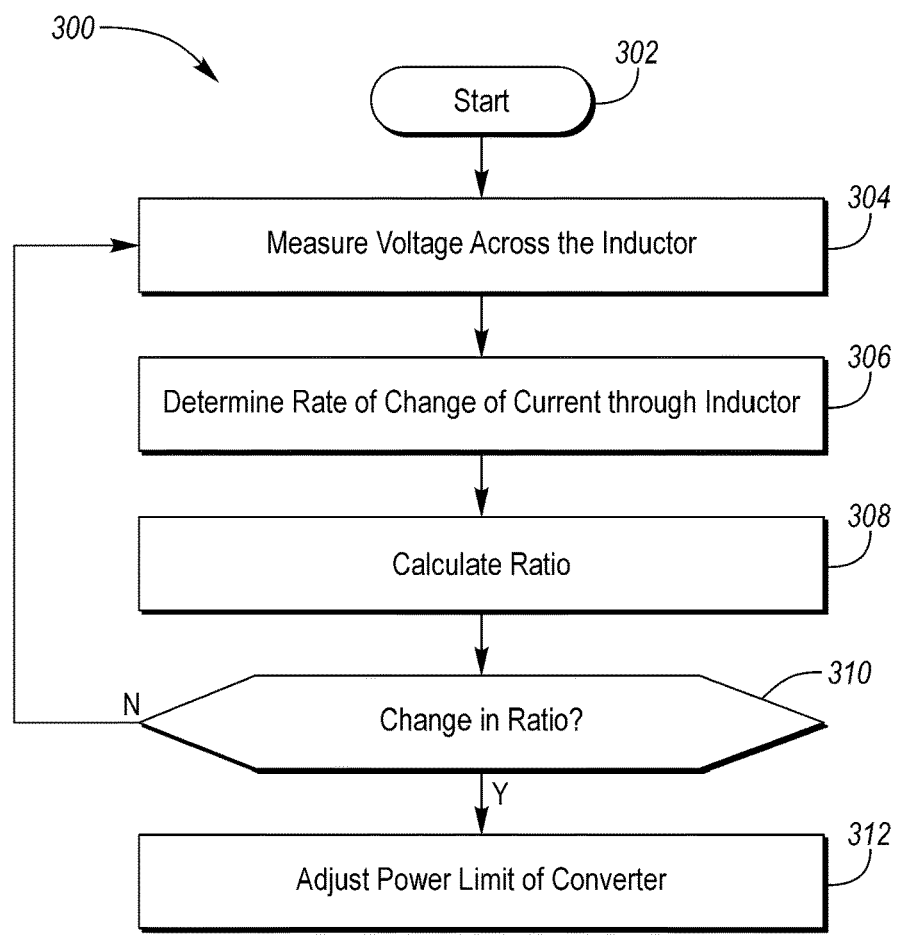
FIG. 3 is an algorithm for adjusting the power threshold of the converter.

Referring to FIG. 3, an algorithm 300 for operating the controller or group of controllers is shown. In step 302, the algorithm starts. In step 304 the controller measures the voltage across the voltmeters 180 to determine the voltage across the inductor 120. The voltage may be gathered from other sources (e.g., traction battery voltage). In step 306, the controller may determine the rate of change of current through the inductor 120 by measuring the current through the inductor with ammeter 130. The controller may then calculate the di/dt using a numerical method or another implement. The controller 102 may also receive the rate of change information from a different controller or set of controllers. In step 308, the controller 102 calculates the ratio between the voltage across the inductor 120 and the rate of change of current through the inductor 120. The calculation may indicate the inductance of the inductor 120, as shown in Equation 1.

$$\frac{V}{\left(\frac{di}{dt}\right)} = L \quad (1)$$

In step 310, the controller may compare the ratio to a previously calculated ratio to determine whether a change has occurred. If the ratio has increased, the controller may decrease the power limit of the converter. If the ratio has decreased, the controller may increase the power limit of the converter. The default power limit may be set based on the characteristics of the converter. For example, the converter may have a maximum temperature of 200° F. The controller 102 may control the temperature rise through the converter 110 by controlling the switches 210 through 220. The switches 210 through 220 of inverter 200 may be controlled to adjust the power pushed or pulled through the converter 110 based on the power threshold. For example, the power threshold may limit the ON cycle (conducting period) of the switches 210 through 220 to a related time or may employ other field oriented control techniques to control power flow through the converter 110.

Figure 4:
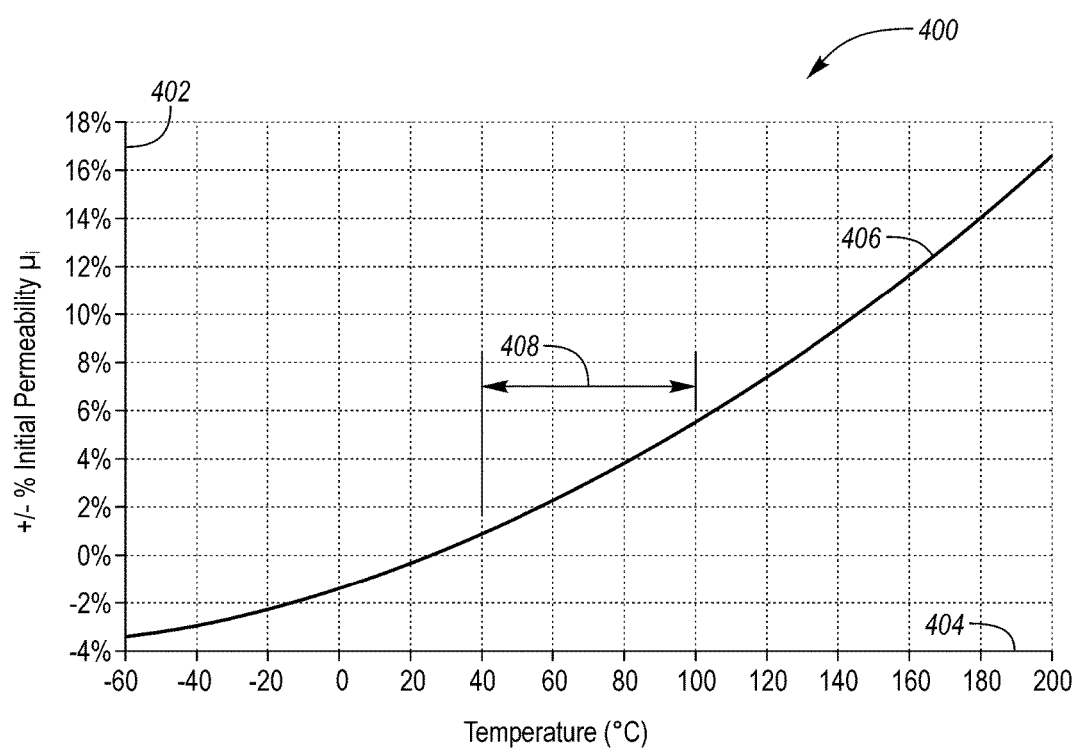
FIG. 4 is a graph depicting an inductor core having an initial permeability that is a monotonic function of the temperature of the core.

Referring to FIG. 4, an inductor 120 permeability graph 400 is shown. The initial permeability 402 is generally monotonic with respect to temperature 404, as shown by curve 406. The teachings of this disclosure may be applied to any material where the initial permeability and temperature are monotonic within a predetermined range 408 because the ratio may be indicative of the inductor temperature when the inductor 120 is operating within a predetermined temperature range. For example, the powder core initial permeability and temperature is shown in FIG. 4 are monotonic across the predetermined operating range of the inductor 120. The controller 102 may be configured to maintain the temperature of the inductor 120 within the monotonic range to ensure the ratio corresponds to the temperature of the inductor 120. The inductance may also depend on the magnitude of current going through the inductor, and the controller may be configured to further correlate known permeability and current magnitude values to ensure that the property in FIG. 4 are maintained. For example, the curve 406 may be algorithmically translated on the graph 400 to account for the current magnitude as it relates to temperature and permeability.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
a power converter including an inductor electrically disposed between a traction battery and an electric machine; and
a controller configured to, responsive to an increase of a ratio of voltage across the inductor to a rate of change of current through the inductor, reduce a maximum allowable ON period for switches of the power converter to reduce a power limit of the power converter.

2. The vehicle of claim 1, wherein the controller is further configured to, responsive to a decrease of the ratio, increase the power limit of the power converter.

3. The vehicle of claim 1, wherein the inductor includes a core having an initial permeability that is a monotonic function of temperature of the core.

4. The vehicle of claim 1, wherein the inductor includes a powdered iron core.

5. The vehicle of claim 4, wherein the powdered iron core is a Molypermalloy Powder core.

6. The vehicle of claim 5, wherein the Molypermalloy Powder core has an initial permeability of 550μ.

7. A vehicle comprising:
a power converter including an inductor electrically disposed between a traction battery and an electric machine; and
a controller configured to, responsive to a decrease of a ratio of voltage across the inductor to a rate of change of current through the inductor, increase a maximum allowable ON period for switches of the power converter to increase a power limit of the power converter.

8. The vehicle of claim 7, wherein the controller is further configured to, responsive to an increase of the ratio, reduce the power limit of the power converter.

9. The vehicle of claim 7, wherein the inductor includes a core having an initial permeability that is a monotonic function of temperature of the core.

10. The vehicle of claim 7, wherein the inductor includes a powdered iron core.

11. The vehicle of claim 10, wherein the powdered iron core is a Molypermalloy Powder core.

12. The vehicle of claim 11, wherein the Molypermalloy Powder core has an initial permeability of 550μ.

13. A method comprising:
by a controller,
responsive to a change of a ratio of voltage across an inductor to a rate of change of current through the inductor, adjusting a maximum allowable ON period for switches of a power converter to adjust a power limit of the power converter including the inductor electrically disposed between a traction battery and an electric machine.

14. The method of claim 13, wherein the adjusting is an increase in the power limit when the change is a decrease.

15. The method of claim 13, wherein the adjusting is a decrease in the power limit when the change is an increase.

16. The method of claim 13, wherein the inductor includes a core having an initial permeability that is a monotonic function of temperature of the core.

17. The method of claim 13, wherein the inductor includes a powdered iron core.

18. The method of claim 17, wherein the powdered iron core is a Molypermalloy Powder core.

19. The method of claim 18, wherein the Molypermalloy Powder core has an initial permeability of 550μ.

* * * * *